(12) United States Patent
Rosenbluth

(10) Patent No.: US 7,685,559 B2
(45) Date of Patent: Mar. 23, 2010

(54) STEP-WALK RELAXATION METHOD FOR GLOBAL OPTIMIZATION OF MASKS

(75) Inventor: Alan E. Rosenbluth, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/416,312

(22) Filed: Apr. 1, 2009

(65) Prior Publication Data

US 2009/0199150 A1    Aug. 6, 2009

Related U.S. Application Data

(62) Division of application No. 11/627,418, filed on Jan. 26, 2007, now Pat. No. 7,587,702.

(51) Int. Cl.
*G06F 17/50* (2006.01)
*G03C 5/00* (2006.01)

(52) U.S. Cl. ............... 716/19; 716/21; 430/30

(58) Field of Classification Search .......... 716/19, 716/21; 430/30
See application file for complete search history.

(56) References Cited

U.S. PATENT DOCUMENTS

| | | | |
|---|---|---|---|
| 5,680,588 A | 10/1997 | Gortych et al. | 395/500 |
| 6,223,139 B1 | 4/2001 | Wong et al. | 703/5 |
| 6,563,566 B2 | 5/2003 | Rosenbluth et al. | 355/67 |
| 7,057,709 B2 | 6/2006 | Rosenbluth | 355/69 |
| 2005/0122501 A1 | 6/2005 | Rosenbluth | 355/69 |
| 2005/0142470 A1 | 6/2005 | Socha et al. | 430/30 |
| 2005/0257187 A1 | 11/2005 | Gallatin et al. | 716/21 |
| 2005/0286764 A1 | 12/2005 | Mittal et al. | 382/181 |
| 2007/0028206 A1 | 2/2007 | Chou et al. | 716/21 |
| 2007/0198963 A1 | 8/2007 | Granik et al. | 716/19 |
| 2008/0016487 A1 | 1/2008 | Wen et al. | 716/21 |

*Primary Examiner*—Stacy A Whitmore
*Assistant Examiner*—Magid Y Dimyan
(74) *Attorney, Agent, or Firm*—Harrington & Smith

(57) ABSTRACT

A set of candidate global optima is identified, one of which is a global solution for making a mask for printing a lithographic pattern. A solution space is formed from dominant joint eigenvectors that is constrained for bright and dark areas of the printed pattern. The solution space is mapped to identify regions each containing at most one local minimum intensity. For each selected region, stepped intensity contours are generated for intensity of the dark areas and stepped constraint surfaces are generated for a target exposure dose at an individual test point. An individual test point is stepped toward a lowest intensity contour along the stepped constraint surfaces of each selected region. Further lowering of the intensities of these points is also detailed, where possible in adjacent regions, to yield final test points. The set of candidate global optima is the final test points at their respective lowest intensity contour of the respective selected regions.

20 Claims, 12 Drawing Sheets

STEP-WALK RELAXATION METHOD FOR GLOBAL OPTIMIZATION OF MASKS

PRIORITY STATEMENT

This application is a divisional of U.S. patent application Ser. No. 11/627,418 which was filed on Jan. 26, 2007 now U.S. Pat. No. 7,587,702, and claims benefit thereto under 35 U.S.C. § 121.

TECHNICAL FIELD

The teachings detailed herein relate to optimization of an optical mask, such as for example a photolithographic mask for printing circuit patterns on a semiconductor wafer or chip.

BACKGROUND

As circuitry and connecting lines on semiconductor wafers becomes smaller, research has focused on optimizing the optical system through which those printed lines are lithographed onto the wafer. As a general overview and in reference to FIG. 1, a driver 20 controls an illumination controller 23 that drives an illumination source 24 to illuminate a mask 26 or reticle. The mask includes features that act to diffract the illuminating radiation through a pupil 28 which may control directional extent of the illumination, and through a lens 30 onto an image plane such as a semiconductor wafer 32. The wafer 32 typically includes a resist (photoactive material). When the resist is exposed to the projected image, the developed features in the resist closely conform to the desired patterns forming a target image, which is now on the wafer 32. The pattern of features on the mask 26 acts as a diffracting structure analogous to a diffraction grating. Increased precision in the formed circuitry depends on minimum and maximum intensities of the illumination that strikes different positions of the wafer 26.

U.S. Pat. No. 5,680,588 describes a system in which global optimum illumination is found based on the desired characteristics of the image irradiance distribution embodied in a target aerial image. Optimum illumination is that which produces an aerial image closest to the predefined target aerial image. The source distribution necessary to achieve that closest aerial image derives from a set of aerial images that are created by addressing the available entrance pupil regions.

U.S. Pat. No. 6,563,566 describes a method to optimize combinations of illumination and mask patterns together to produce a desired pattern, such that the resulting mask patterns do not necessarily correspond to the desired patterns to be printed (e.g., by exploiting destructive interference to define dark areas that are not constrained to conform to the desired printed pattern). Because these optimal mask solutions often do not resemble the patterns being printed on the wafer, those optimal mask solutions are difficult to find using conventional optimization techniques. This invention extends the teachings of U.S. Pat. No. 6,563,566, which is hereby incorporated by reference. U.S. Pat. Publ. No. 2005/0122501 describes illuminating a mask with light from different directions so that intensities of the various light beams provide a larger integrated process window, including maximum intensities for overexposed tolerance positions and minimum intensities for underexposed tolerance positions.

Integrated circuit cells can be fabricated with higher yields if the lithographic masks used to print the circuit features are designed by global optimization, as described in U.S. Pat. No. 5,680,588 noted above. In this procedure the mask patterns are optimized to print an acceptable image with as large a process window as possible. When the optimization is carried out in a global way, the resulting solutions often differ from standard design forms, particularly when the illumination contains strong off-axis components, since in this case images are formed with bright and dark interference lobes whose positions are very different from those of the diffracting mask features. When the cell contains circuit elements that are difficult to print, the difference between the globally maximum process window and the process window provided by a conventionally optimized design can determine whether or not it is feasible to manufacture the cell.

Global optimization is particularly described in a paper by Rosenbluth, et al., entitled "Optimum Mask and Source Patterns to Print a Given Shape," JM3 1, no. 1 (2002): p. 13, hereinafter referred to as "Rosenbluth et al.".

However, one impediment to wider adoption of the global method described in Rosenbluth et al. is its significant computational cost, which increases very rapidly as cell size is increased. A speed 'bottleneck' arises in globally optimizing the wavefront that projects from the mask 26, i.e. finding the mask diffraction pattern which produces the highest possible process window when deployed with some given source 24 (fixed, at least temporarily). Note here that "diffraction pattern" is a shorthand term for the set of diffraction orders that are collected by the lens 30 when the particular fixed source 24 is employed.

This invention reduces that complexity so that optimal masks can be designed and prepared for a large target surface 32, such as a SRAM or DRAM would require.

SUMMARY

The foregoing and other problems are overcome, and other advantages are realized, in accordance with the presently described embodiments of these teachings.

In accordance with an exemplary embodiment of the invention, there is provided a method for outputting a set of candidate global optimum points for a mask such as may be used to make a lithographic printed pattern. The method includes defining a solution space formed from dominant joint eigenvectors for the printed pattern that is both constrained to be bright for bright areas of the printed pattern and that is constrained to be dark for dark areas of the printed pattern. The solution space is mapped to identify regions, each region containing at most one local minimum intensity for a dark area. At least some of the regions are selected for test point analysis. For each of the selected regions, stepped intensity contours are generated for intensity of the dark areas and stepped constraint surfaces are generated for a target exposure dose at an individual bright point. Within each selected region, a test point is initially chosen at the center of the region, and is then stepped toward a lowest intensity contour along the stepped constraint surfaces to yield a final test point. This leaves only one final test point in each selected region, as only the test point with the lowest intensity is retained as the final test point. A set of candidate global optimum points is output, and that set includes the individual final test points at their respective lowest intensity contour of the respective selected region.

In accordance with an exemplary embodiment of the invention, there is provided a program of machine-readable instructions, executable by a digital processor and tangibly embodied on a computer readable memory, configured to perform operations to output a set of candidate global optimum points for a mask operable to make a printed pattern. The operations of the program include defining a solution space formed from dominant joint eigenvectors for the printed pattern that is both constrained to be bright for bright areas of the printed pattern and that is constrained to be dark for dark areas of the printed pattern. Then, the program maps the solution space to identify regions, each region containing at most one local minimum intensity for a bright area. At least some of the identified regions are selected for test point analysis. For each of the selected regions, the program generates stepped intensity contours for intensity of the dark areas and stepped constraint surfaces for a target exposure dose at an individual bright point. Within each selected region, the program progressively steps the test point toward a lowest intensity contour along the stepped constraint surfaces to yield a final test point. A set of candidate global optimum points that include the final test points at their respective lowest intensity contour of the respective large region is then output. From this set, one global optimum point may be found, such as using the prior art techniques described in the background section, and a mask may be made from that global optimum point.

In accordance with an exemplary embodiment of the invention, there is provided a method for identifying candidate globally optimum inputs for generation of outputs that optimally approximate according to a performance metric a binary target pattern of areas constrained to be bright and areas constrained to be dark, where the output is inherently non-negative and depends in a quadratic way on the inputs. In the method, a solution space for the inputs is formed from dominant joint eigenvectors for quadratic forms of bright and dark areas of a target pattern. The solution space is mapped to identify regions that include at most one local minimum. At least some of the regions are selected for test point analysis. Stepped intensity contours are generated for the dark areas and stepped constraint surfaces are generated for individual bright points. Within each selected region, an individual test point is moved progressively to the lowest intensity contour step along all constraint steps present in the selected region. For each individual test point at the lowest intensity contour step of the selected region, intensity is further reduced, if a reduced intensity is available, by stepping to a lowest intensity contour step in an adjacent selected region. For each individual test point at an edge of an intensity contour step, it is tested whether an intensity contour step of an adjacent selected region is lower. If so, then intensity of that individual test point is reduced to a lowest intensity contour step of the adjacent selected region to yield a final test point. The final test points at their respective lowest intensity contour step are compiled as a set of candidate global optima, and that set is evaluated using the performance metric to determine one globally optimum input solution from which a mask is made.

Further details as to various embodiments and implementations are detailed below.

BRIEF DESCRIPTION OF THE DRAWINGS

The foregoing and other aspects of these teachings are made more evident in the following Detailed Description, when read in conjunction with the attached Drawing Figures, wherein.

DETAILED DESCRIPTION

In accordance with exemplary and non-limiting embodiments of the invention, a method is described that reduces the number of potential local minima to be searched when employing global optimization in the design of optical process masks, particularly lithographic masks. As described more fully below, exemplary embodiments of the method of the invention provide a method for more readily identifying a set of local intensity minima likely to include the global minimum. Once identified, each member of the set can be further examined using a more computationally intensive group of parameter space constraints, such as described in U.S. Pat. No. 6,563,566.

In this description, the term "test" point indicates a trial mask solution (or diffraction pattern) as represented by a point in parameter space, and may be also considered as a "trial solution". The term "bright point" indicates a sample point at which the projected image is specified to be of bright polarity. Stepped constraint surfaces are described as corresponding to different bright sample points.

Figure 1:
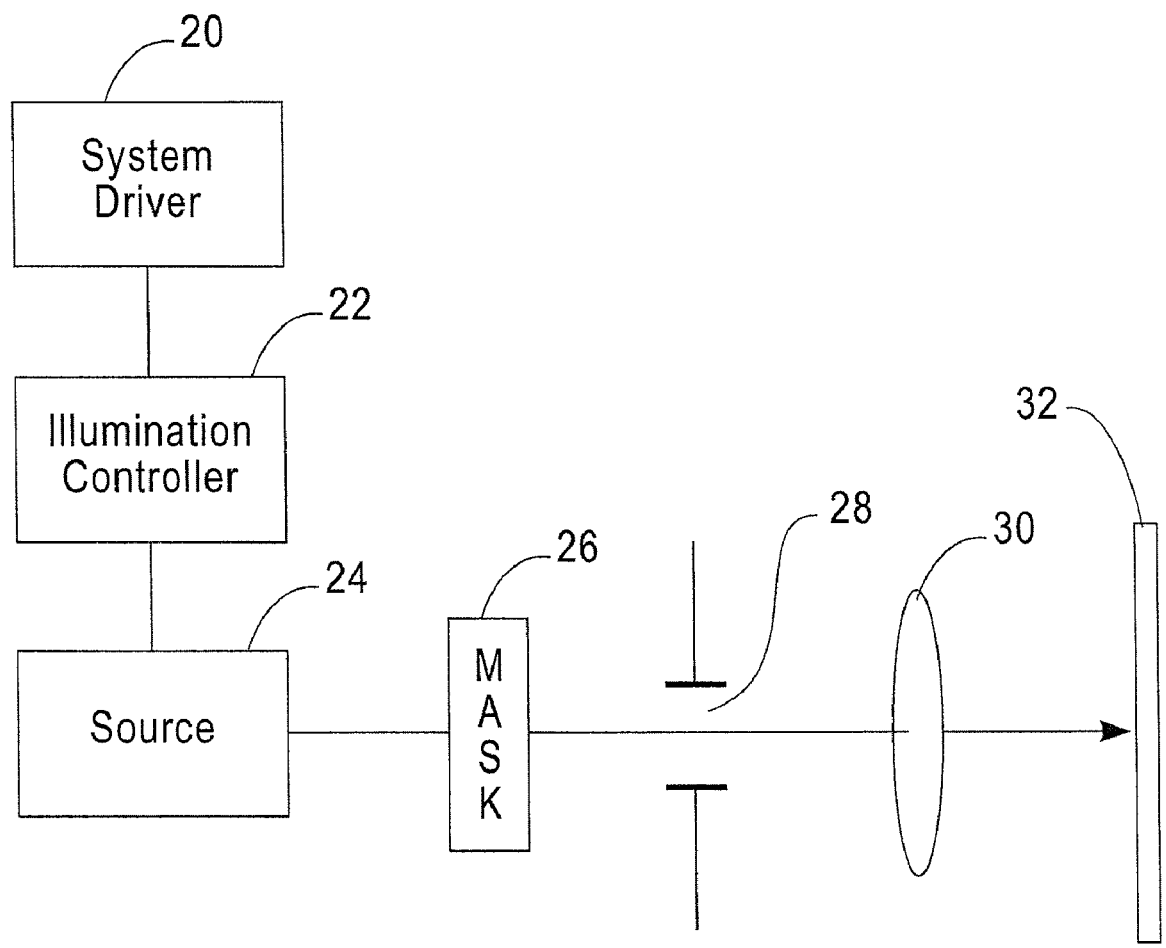
FIG. 1 is a diagram of an apparatus known in the art for performing photolithography.
Figure 2A:
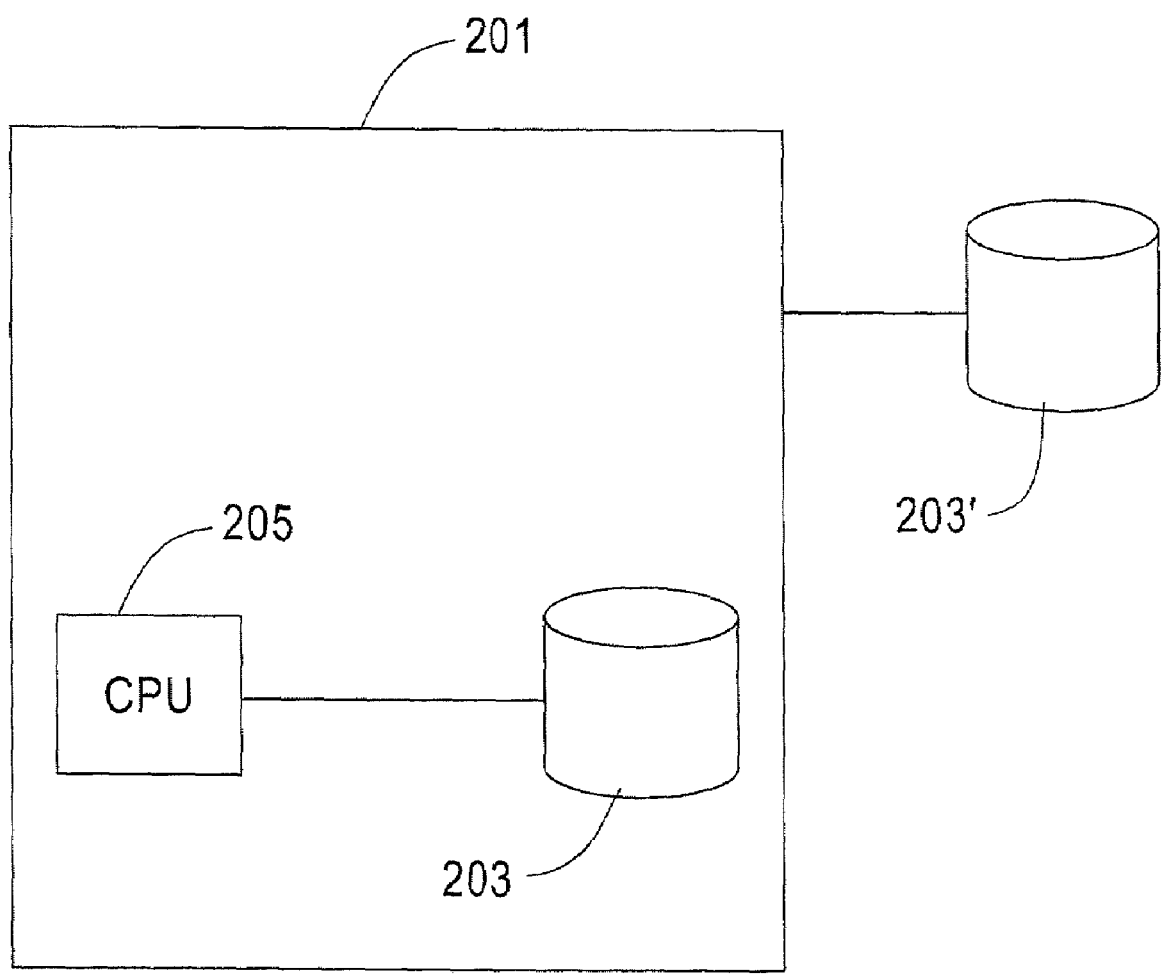
FIG. 2a is a diagram of an exemplary embodiment of an apparatus for performing exemplary embodiments of the method of the invention.

With reference to FIG. 2a there is illustrated an exemplary apparatus for computing a mask 26 according to exemplary embodiments of the invention. An digital processing apparatus 201 is formed of processing unit 205. Examples of digital processing apparatus 201 include, but are not limited to personal computers, mainframe computers, and networked, distributed computing devices. Processing unit 205 can include central processing units (CPUs) and can be fabricated on an integrated circuit or circuits. Digital processing apparatus 201 can further include internal memory 203 coupled to processing unit 205 for storing and retrieving digital data by the processing unit 205. In addition, external memory 203' can be coupled to digital processing apparatus 201. The digital data stored in memory 203, 203' can include software instructions for performing the process steps described below for carrying out the exemplary embodiments of the method of the invention.

Figure 2B:
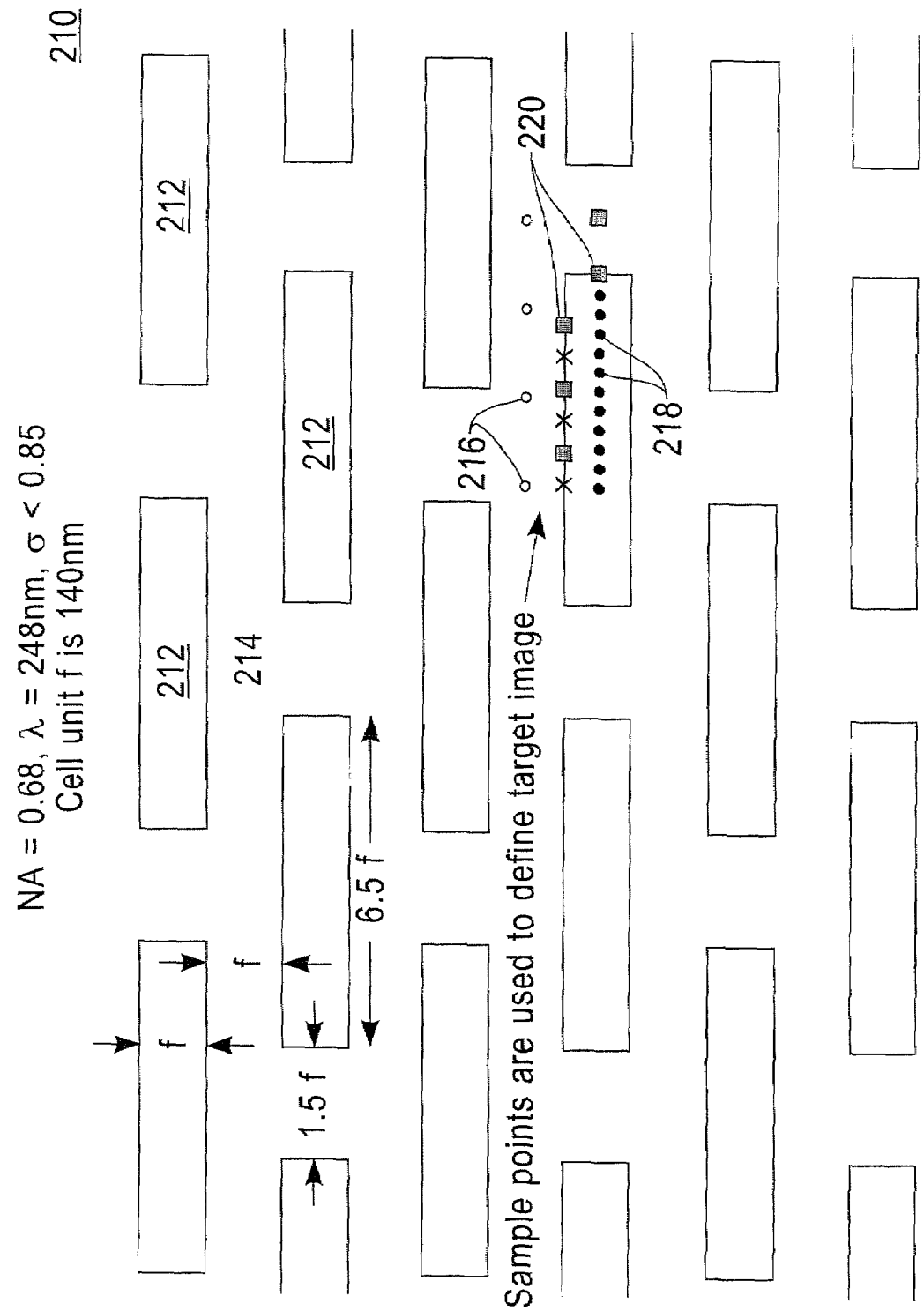
FIG. 2b is a schematic diagram of an isolated portion of a DRAM circuit, used to describe the invention.

FIG. 2b illustrates a circuit pattern 210 isolated from a larger DRAM device that gives context to the description of the invention. The rectangles represent dark areas/regions 212 on a semiconductor surface 32 that are not conductive. The remaining areas/regions 214 between the dark regions 212 represents conductive traces/circuit lines that are the bright areas/regions 214. The acronym NA is known in the art, and represents the sign of the half angle of collection of the imaging lens 30. A larger angle indicates higher lens resolution. The symbol λ conventionally represents wavelength from the source 24 (optimal for the resist being used at the surface 32), so λ/NA is used in the art as a scaling factor for lens resolution. The required resolution is then f, 140 nm for the isolated print of FIG. 2b. As shown, lateral separation of the dark regions 212 is 1.5f, and vertical separation is f. In the prior art, 1.5f lateral spacing with precision has been a particularly difficult manufacturing metric to achieve.

Below the invention is described with reference to different sample points. FIG. 2b shows by example that light sample points 216 are within the light region 214, dark sample points 218 are within the dark region 212, and edge sample points 220 are along or immediately adjacent to a boundary between the light 214 and dark 212 regions. Analysis of these intensity and position that different parameter spaces would print these points is an underlying mechanism of embodiments of this invention. More particularized categories of sample points, and their advantageous placement, are detailed further following description of the broader aspects of the invention. A goal is to achieve a minimum intensity for the bright areas/sample points while maintaining sufficient contrast against the intensity of the dark areas/sample points so as to preserve the conduction/no conduction quality in the printed semiconductor.

Figure 3:
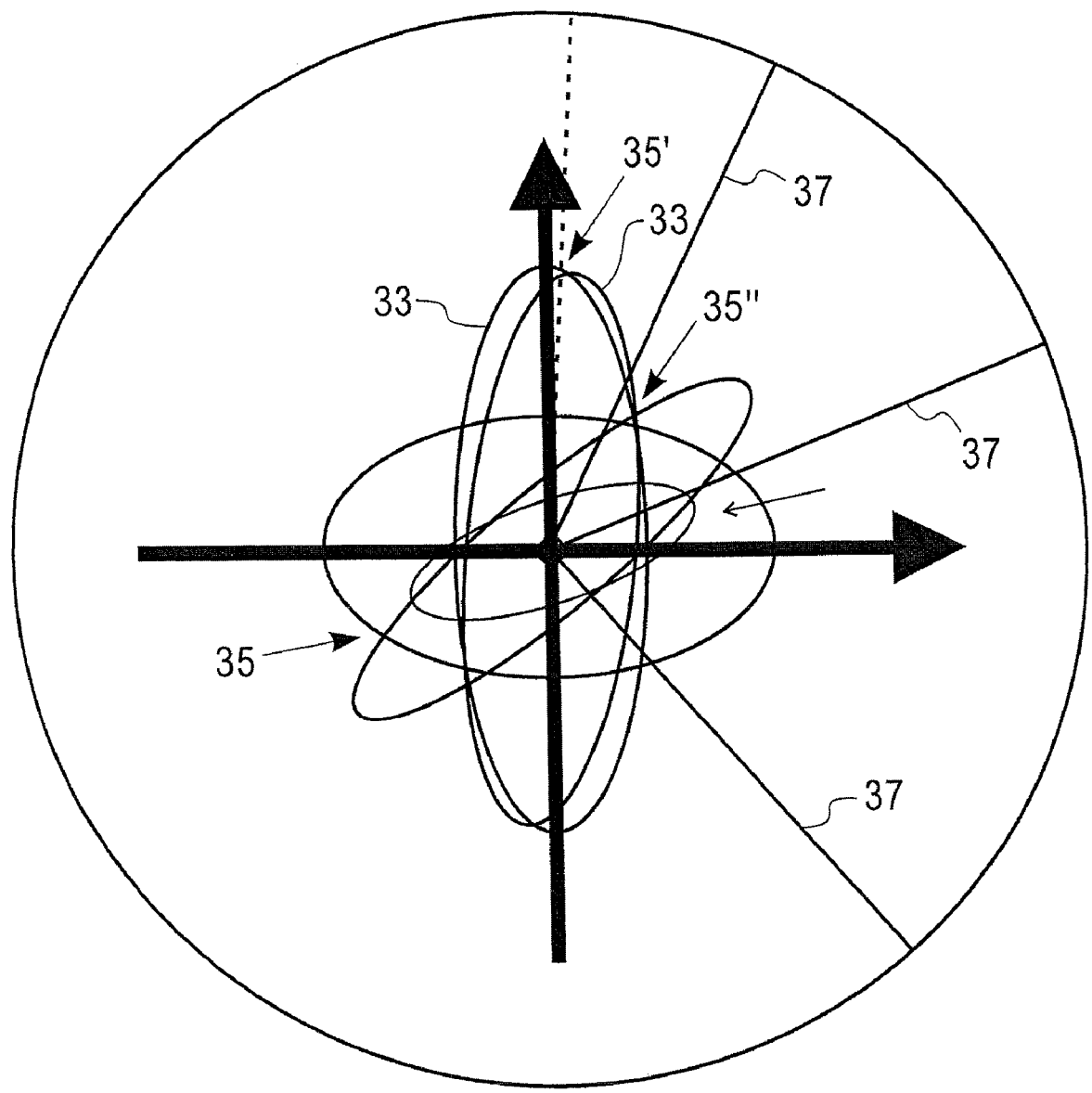
FIG. 3 is a diagram of a parameter space known in the art for performing global optimization.

With reference to FIG. 3, there is illustrated two dimensions of a parameter space 31 wherein each Cartesian direction represents a portion of one joint eigenvector that could be included in the mask solution. While illustrating only two dimensions, the actual number of joint eigenvectors considered (the dimensionality of the solution) is the number needed to print every bright spot 216 in the desired mask. As illustrated, each of the two illustrated Cartesian axes correlate to a joint eigenvector formed as the linear combination of diffraction order amplitudes. The average intensity of a dark region 212 of a mask pattern is the formed of the linear sum of eigenvector intensities while the average bright-region 214 intensity is a weighted linear sum of eigenvector intensities. As a result, as far as average bright or dark intensity is concerned, interference non-linearities are removed. This property allows some eigenvectors to be removed as needlessly degrading overall contrast. The eigenvectors can be calculated by the methods explained in U.S. Pat. No. 6,563,566.

At any point in the parameter space 31, the distance from the origin is equal to the intensity in dark regions 212 of the image as measured in plane 32 at the defocus limit. A non-negligible intensity in the dark regions 212 is undesirable, and is of particular concern at those portions of the dark regions 212 near the edges of the image. As each bright image point 216 requires adequate intensity, there results multiple non-convex quadratic constraints that limit how closely the origin can be approached.

The five exemplary ellipsoids 33 of FIG. 3 each represent a different single bright sample point 216 in the mask image. While understated in FIG. 3, the axes of the ellipsoids 33 tend to be aligned with the Cartesian axes. Between the boundaries of the ellipsoids 33 are formed pockets 35. Each pocket is formed by the intersection of one or more ellipsoids 33 and extends inwards to the origin to an area closest to the origin. Each pocket 35 represents a potential minimum allowable intensity for one or more bright points. Because, as noted above, many ellipsoids are aligned with the Cartesian axes, there are formed numerous narrow pockets 35' near one or the other Cartesian axes. As these pockets 35' tend to be relatively far from the origin, they can be ignored when searching for pockets possibly containing a global minimum intensity. Narrow pockets also tend to represent regions of high sensitivity to mask error, because most small changes in the position of a test point will cause the intensity at more than one bright point to rapidly drop below minimum allowable intensity. Test points in such pockets are said to have high Mask Error Factor (MEF). In contrast, pockets 35, 35" are wider and are more likely to contain a local minimum intensity. In addition, as noted above, while each pocket 35 represents a potential minimum intensity, many pockets do not in fact contain local minima. There are additionally illustrated numerous solution vectors 37. Each solution vector 37 is an origin pointing path to be traversed when searching for pockets 35 forming a local minimum.

Figure 4:
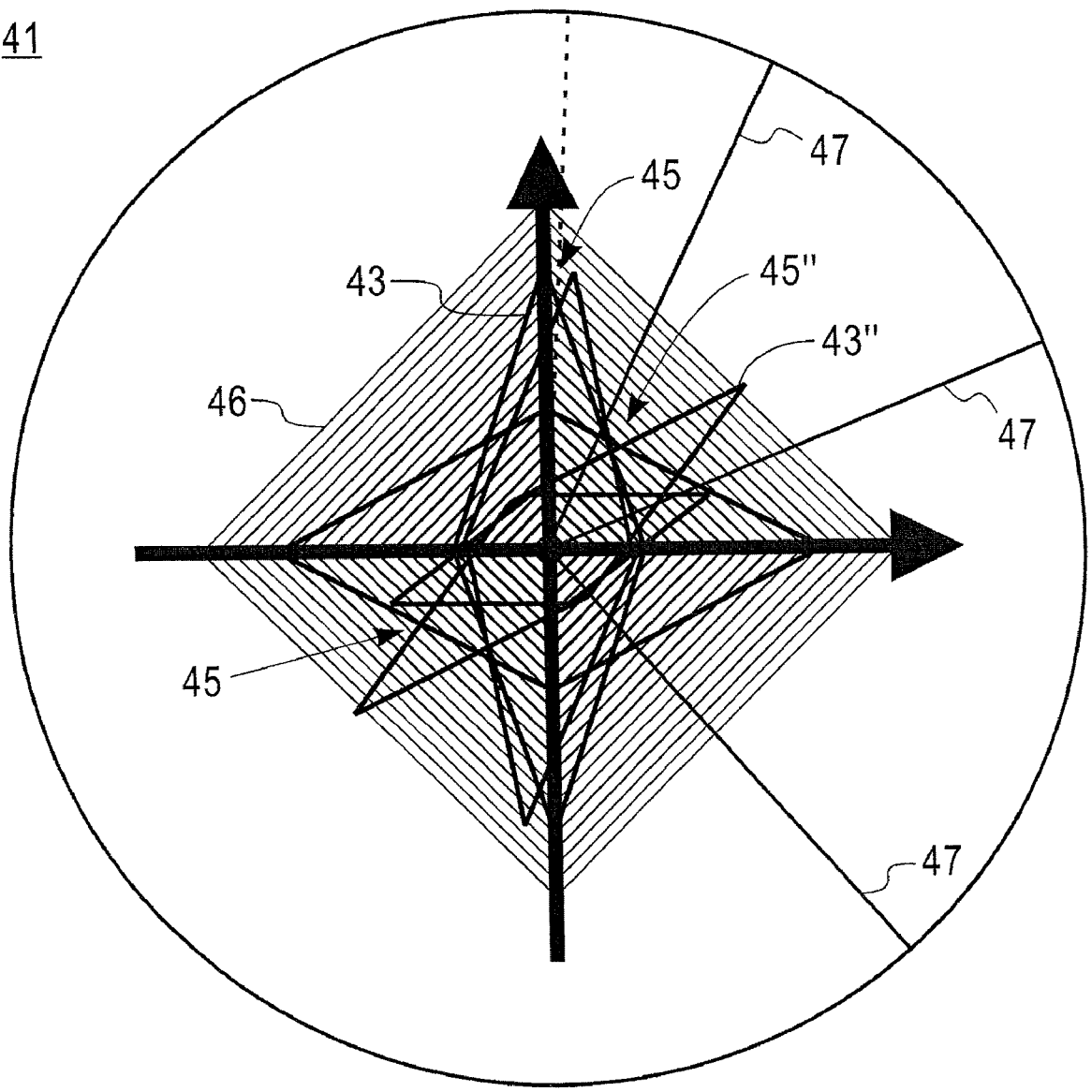
FIG. 4 is a diagram of an exemplary embodiment of a parameter space of the invention.

With reference to FIG. 4, there is illustrated an exemplary two-dimensional parameter space 41 according to the invention. For purposes of comparison, there are illustrated the same five ellipsoids 33 from FIG. 3, but, in the present examples, they are shown as diamond shaped linear constrained ellipsoids 43 Each exemplary linear constrained ellipsoid 43 has a counterpart ellipsoid 33 in the parameter space 31 of the prior art. As will be shown, using linear constrained ellipsoids 43 formed of linear approximations of the true ellipsoids 33 from FIG. 3 reduces the number of computations required to search for local minimums. In addition to the linear constrained ellipsoids 43, there are shown a plurality of intensity steps 46 or contours defined as flat steps based on the sum of positive projections against the Cartesian axes. These are the 'steps' in the step-walk relaxation approach described herein. Note as well that the quadrants of the linear constrained ellipsoids 43 are approximated as flat steps based upon the sum of positive projections against the ellipsoid axes. Signs of projections onto the axes (either +1 or −1) distinguish one step from another. As before, a plurality of solution vectors 47 are illustrated.

Figure 5:
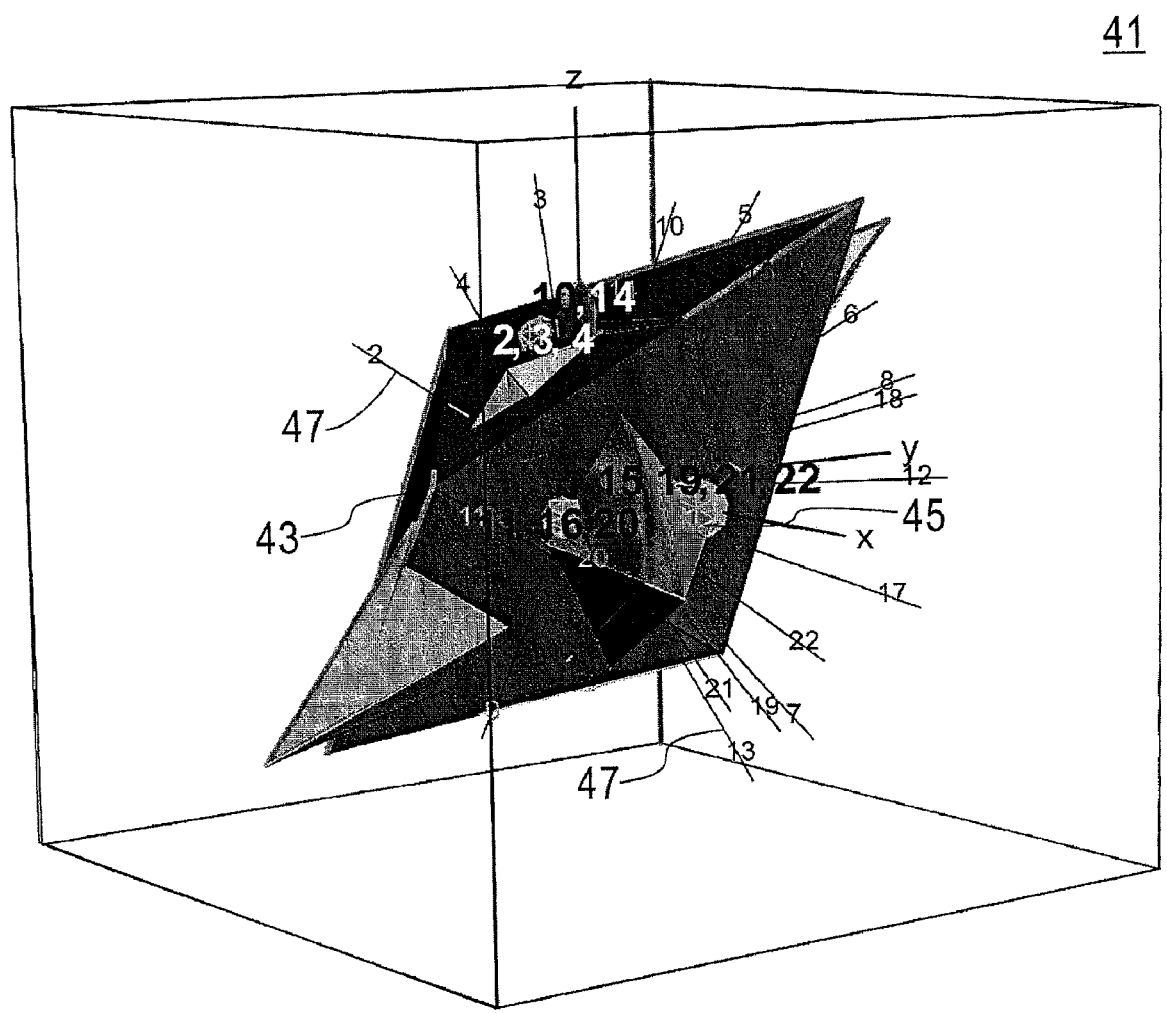
FIG. 5 is a perspective view of an exemplary embodiment of a three-dimensional parameter space of the invention.

As noted above, the illustration of the parameter space of FIG. 4 shows only two dimensions. In practice, exemplary methods of the invention are performed in multidimensional parameter spaces 41. With reference to FIG. 5, there is illustrated a perspective view of a three-dimensional rendering of an exemplary embodiment of a parameter space 41. In three dimensions, the linear constrained ellipsoids 43 appear as three-dimensional diamonds. Solution vectors 47 extends in three dimensions. In the example shown, there are twenty-two solution vectors that are traversed towards the origin and along the faces of linear constrained ellipsoids 43 to determine local intensity minimums. As discussed more fully below, the local minimums identified by traversing a plurality of solution vectors 47 can all map to the same pocket 45 identifying a potential local minimum. As shown, for example, a single local intensity minimum is obtained by proceeding down solution vectors 47 numbered 15, 19, 21, and 22.

In general, since only broad and deep potential local minima regions need be searched as opposed to all pockets including the narrow ones described with FIG. 3 (note that the latter is not known in advance), one can initially approximate the intensity at any bright sample point 216 as a flat step when testing trial solutions within the region. A substantial majority of the regions that potentially contain local intensity minima will prove in fact not to contain enclosed minima, since many of the ellipsoid quadrant choices that define the region will turn out to involve constraints that are not binding at the lowest point in the region. For this reason one expects to encounter many regions that will prove able to be stepped downward out of and such regions can thereafter be neglected. These downward steps can be taken very rapidly using linear programming, since the steps are flat. When one has taken all possible downward steps from some region being tested, one records the region arrived in. After this downward-stepping evaluation has been repeated for every potential local minimum region, one will have pruned the set of trial regions from the large set which potentially contain local minima to a considerably smaller set which actually contain them (according to the step approximation), resulting in a considerably smaller set that can then be processed with the prior art algorithm. In this manner, complexity in finding an optimal mask is substantially reduced by the above step-walking toward the smaller set. This complexity reduction allows one to design a mask 26 for larger scale circuits such as SRAM and DRAM scales.

To appreciate the computation savings afforded by the above step-walk approach, the prior art non-linear approach is now summarized. As is known, the optimum diffraction pattern is calculated in a basis formed from the dominant joint eigenvectors for average intensity in the bright parts of the target image, and average intensity in the dark parts of the target image. Each basis direction $x_j$ in this subspace is a coordinate representing the portion of the $j^{th}$ joint eigenvector that can be included in the mask diffraction pattern. Each joint eigenvector is a linear combination of the diffraction orders, taken in a proportion that may be calculated.

As a consequence of the joint eigenvector subspace choice, the average dark region intensity produced by a mask diffraction pattern will be proportional to the summed squares of its coordinates in the subspace. It is convenient to employ dose units in which the constant of proportionality is unity, so that the average dark region intensity is given by $$I_D = \sum_{j=1}^{j_{Dom}} x_j^2. \quad [1]$$

In such units the average bright region intensity will be given by $$I_B = \sum_{j=1}^{j_{Dom}} e_j x_j^2, \quad [2]$$

where $e_j$ is the $j^{th}$ eigenvalue for average bright-region intensity and $x_j$ is the basis direction j of the $e_j$ eigenvalue. Thus the vector $\vec{x}$ which represents the global solution is the set of all $x_j$, simplified by reducing the summation to the reduced set $j=1, 2, \ldots J_{Dom}$, only the dominant eigenvalues rather than all of the j eigenvalues.

One variation to the prior art that may be employed with the step-walk relaxation approach described herein is that the $I_B$ intensities can be based on weighted bright region intensities that emphasize the bright region boundary over the bright region interior (by giving the so-called "edge sample points" 220 near the boundary but within the bright region 214 at least half the total bright region 214 weight, even when they are outnumbered by the "interior bright sample points" 216). Similarly, another variation, alone or in combination with that above, can weight the $I_D$ intensities to emphasize the intensity in those dark regions 212 that are in close proximity to the edge of the bright region 214 (by giving the so-called "perimeter dark sample points" 220 near the boundary but lying within the dark region 212 at least half the total dark region 212 weight, even when they are outnumbered by the "interior dark sample points" 218). These eigenvalues are sorted in descending order. $J_{Dom}$ is the number of dominant joint eigenvectors that are included in the subspace. $J_{Dom}$ is essentially determined by choosing the minimum number of joint eigenvectors needed to expose every bright point (both interior bright points 216 and edge bright points 220) in the image. Including additional joint eigenvectors would unnecessarily degrade image contrast.

To find the globally optimum solution for $\vec{x}$, the prior art checks every region of the parameter space that might contain a local solution, taking advantage of any simplifications that permit reducing the size of the search space, such as the above restriction to the $J_{Dom}$ subspace. To speed execution, the unknown list of regions that might contain the solution is approximated by tabulating the set of potential local solutions to a simpler max-contrast problem:

Minimize $\vec{x}^T \vec{x}$ subject to:

$$\vec{x}^T A_u \vec{x} \geq 1, (\forall u | 1 \leq u \leq u_{Max}), \quad [3]$$

where $A_u$ denotes a matrix that provides the intensity at the $u^{th}$ bright sample point.

Note that "intensity" can actually include such effects as resist blur, focal blur, and mask blur. The objective function in eq. [3] is simply the average dark-region intensity (which for small cells is unlikely to be minimized if it contains any points that are bright enough to print). Contrast is thus improved in this subspace when a potential solution is able to move closer to the origin without violating any of the constraints. By convention, this origin-pointing direction for dark-region intensity reduction is referred to herein as downward. Note that intensity is usually calculated in a defocused plane, or across a narrow band of planes that are defocused. One may choose to converge (essentially, Fourier transform) the joint eigenvectors with relative phases that correspond to zero defocus when selecting the $J_{Dom}$ subspace, even though the bright 214 and dark 212 region intensities that determine the joint eigenvectors may be calculated in a defocused plane.

Let $\vec{w}_{u,i}$ be the $i^{th}$ orthonormalized eigenvector of $A_u$, where the index i represents the axis of an ellipsoid in the parameter space (see FIGS. 3 and 4) It can be shown that any two masks $\vec{x}$ and $\vec{x}'$ will lie in the same local minimum of eq. [3] if $\vec{w}_{u,i} \cdot \vec{x}'$ has the same sign as $\vec{w}_{u,i} \cdot \vec{x}$ for all u and i. Physically, this means that $\vec{x}$ and $\vec{x}'$ intersect all constraint ellipsoids associated with the constraint quadratic-forms in eq. [3] at the same set of ellipsoid quadrants. (In referring to these zones as "quadrants" we are employing for simplicity a terminology that, strictly speaking, is only appropriate to the 2D ellipsoids of a 2D problem. In a 3D problem it would be more appropriate to refer to these as octants; in many cases of interest the dimensionality is higher than 3, where no precise term is available.) When $\vec{x}$ and $\vec{x}'$ project through the same quadrants of every constraint ellipsoid, they will lie within the same pocket formed by these intersecting ellipsoids, and will then share a local minimum in attainable dark-region intensity.

Thus, the prior art finds the global solution by carrying out multiple local solutions to the mask design problem, solving the problem from starting designs that cover each possible set of sign choices for $\vec{w}_{u,i} \cdot \vec{x}$, and then selecting the best of these solutions. In a large problem it will not be practical to search every such sign combination. This invention enables one to intelligently prune the number of local solutions searched to only a relatively small subset of the total set of possible solutions. The best solution in this subset is very likely to be the global solution. Moreover, while the chosen subset may represent only a small fraction of the complete nominal solution set (consisting of solutions that are technically valid in the sense of satisfying the problem constraints, but that are mostly of extremely poor quality), this chosen subset will still contain a very large number of solutions for cells of SRAM scale or larger. This means that if one carries out the local optimization using a more complex merit function (i.e. objective function) than that in eq. [3], one is unlikely to miss the global solution, so long as the two objective functions are generally similar in character.

The abovementioned reduction in the number of sign combinations that need to be searched is based on special characteristics of the lithographic target shapes of interest. To exploit these characteristics, embodiments of this invention determine the approximate volume occupied by each sign combination in the parameter space, by sampling these sign values on a fine grid. (Note that the sampling referred to here is quite different from the sampling in the image plane by so-called bright 216, dark 218 and edge 220 sample points that is used to characterize images as in FIG. 2b.) The group of grid points found to have identical sign values is assigned a volume equal to the size of the group. This volume approximation enables ready elimination of the narrow packets described with reference to FIG. 3 from further consideration. The criterion for small volume rejection can be refined by using a second stage of grouping. Specifically, once grid points have been grouped on the basis of their sign values, it will usually happen that in many groups at least one ellipsoid will be found to have the property that at no grid point in the group is this ellipsoid the furthest ellipsoid from the origin. The sign values for the axes of any ellipsoid meeting this criterion can then be temporarily assigned the value 0 for grid points in the group. Once all groups and their associated grid points have been temporarily modified in this way, the grid points can then be temporarily regrouped on the basis of their modified sign values. All members of any first stage group will also belong to the same second stage group. In addition to removing first stage groups that have low volume, for example groups which are smaller than average, one can also remove first stage groups which are members of second stage groups that are smaller than average (among the second stage groups), so long as these first stage groups are, for example, no larger than twice the average size (of the first stage groups).

The criterion for small volume rejection can also be refined on the basis of diversity in outermost ellipsoids. As noted, once grid points have been grouped on the basis of their sign values, it will usually happen that in many groups at least one ellipsoid will have the property that at no grid point in the group is this ellipsoid the furthest ellipsoid from the origin. That means that in most groups the number of different ellipsoids which are outermost for one or more grid points will be less than $u_{Max}$, where $u_{Max}$ denotes the total number of bright point ellipsoids. Moreover, in many groups the number of distinct outermost ellipsoids will actually be much less than $u_{Max}$. The threshold for rejecting small volumes can be made quite stringent for groups in which the number of distinct outermost ellipsoids is greater than or equal to $J_{Dom}$, the dimensionality of the parameter space. For example, groups whose number of distinct outermost ellipsoids is greater than or equal to $J_{Dom}$ might be retained as long as they are at least half the size of the average group. For groups which have less diversity in their outermost ellipsoids the rejection criterion can be relaxed in, for example, a proportionate way, so that a group of minimal diversity (that is, a group whose grid points all share the same outermost ellipsoid) might be rejected unless its size were larger than twice the average. The size of the grid spacing can also be considered in setting this range of rejection criteria.

The minimum distance from the origin among all outermost ellipsoids, as taken over all grid points in a group, can also be used to refine the criterion for small volume rejection. Typically this minimum outermost distance criterion might be given less weight than the previously described diversity of outermost ellipsoid content. For example, if the minimum outermost distance in a particular average-sized group were only one fourth as large as the average among all groups of the minimum outermost distance, that particular average-sized group might be retained as long as the diversity in its outermost ellipsoid content was found to be larger than one-half of the average diversity level. However, if the minimum outermost distance in that average-sized group were, as an alternative example, equal to the average among all groups, that group might not be retained unless the diversity in its outermost ellipsoid content were larger than the average diversity level.

The sign values of $\vec{x}$ are not varied when all elements are multiplied by a constant value, so the sampling should not include values that are redundant in this way. This means that sampling is most efficiently carried out on the surface of a $J_{Dom}$-dimensional hypersphere in parameter space, whose radius can be given an arbitrary value, for example one. A uniform gridding of such a hypersphere may be carried out using the following recursive method:

spacing along the final coordinate (the $J_{Dom}$th) is determined first. Spacing along the $J_{Dom}$th axis will have the desired uniformity on the hypersphere if the sampled points' coordinates along this axis are proportional to the cosine of an equistepped iterator θ; and provide uniform sampling along the remaining $J_{Dom}-1$ orthogonal directions that pass through each particular sampled coordinate along the $J_{Dom}$th axis. The problem of achieving uniform sampling within this subset of the full set of sampled points is equivalent to the original problem, except that it takes place in a subspace of lower dimension.

Specifically, uniform sampling along the remaining $J_{Dom}-1$ orthogonal directions that pass through each particular cos(θ) coordinate along the $J_{Dom}$th axis is achieved if those sample points are laid out uniformly on the surface of a $(J_{Dom}-1)$-dimensional hypersphere of radius sin(θ) that is embedded in the hyperplane that is orthogonal to the $J_{Dom}$th axis at the point cos(θ), with this reduced-dimension hypersphere being centered at the cos(θ) point. By recursively reducing the dimension in this way, we reach the trivial problem of uniformly sampling the 0-dimensional endpoints of a line segment (where the solution is simply to place sample points at the endpoints).

The joint eigenvectors tend to have spatially separated lobes which for different eigenvectors will generally be located near different bright sample points. Those eigenvectors which do not have lobes near a particular bright sample point do not interact at that sample point. The sampling on the hypersphere can then be refined based on the sparsity of interactions between the joint eigenvectors at individual bright sample points. For example, it will often happen that only one eigenvector will have a lobe whose center is sufficiently close to some particular bright sample point that the sample point actually falls inside the lobe. When only one eigenvector overlaps some bright sample point, it is unnecessary to achieve a uniform hypersphere sampling along the particular axis corresponding to this eigenvector, because the solution will need to contain a large portion of the eigenvector in order to provide light at the bright sample point. Thus, instead of providing uniform coverage, the sampling need only include points whose coordinate along the particular axis corresponding to the eigenvector is either close to the radius of the hypersphere, or close to the negative of the radius of the hypersphere.

Similarly, it will often happen that only two joint eigenvectors will have lobes sufficiently close to some particular bright sample point that the sample point falls inside each lobe; in other words, it may happen that only two joint eigenvectors interact significantly at a particular bright sample point. In that case, the hypersphere sampling need not uniformly cover all combinations of the two coordinates which correspond to these two eigenvectors. Instead, points on the hypersphere need only be included in the sampling if their coordinates on the two particular axes are such that they provide an intensity at the bright sample point in question which is close to the average intensity. The average intensity provided by any point on the hypersphere is given by eq. [2]. The hyperplane sampling can be further culled on the basis of bright sample points at which only three joint eigenvectors interact, and so forth.

In practice one can ignore potential local minima that are narrow as noted above, since these will have high MEF (mask error factor, a measure of sensitivity to mask error), low volume, and will typically be shallow. [Where a region of the parameter space/gridspace of the hypersphere is narrow, it can't be deep and there is very likely no minima within that pocket, as above with reference to FIG. 3. Volume measurements, as approximated by the number of contained points, identify these narrow pockets for exclusion from further consideration, based, for example, on being below average size.] In fact, such a volume measurement will typically turn up a relatively small set of potential local minima regions having much larger size than the average region, and it is only these high-volume or 'large' regions that need to be searched. This useful circumstance arises because of the binary character of lithographic patterns—the joint eigenvectors are orthogonal and so tend to have spatially separated lobes that are located near the various bright sample points 216, indexed as I, 2, ... $u_{Max}$. As a result the $A_u$ ellipsoids tend to align with the Cartesian axes 1, 2, ... $J_{Dom}$. If this alignment were complete, the number of local minima that would need to be checked would reduce to $2^{J_{Dom}}$. While shrinkage is usually not as strong as this, the number of plausible local intensity minima is still very much smaller than $2^{J_{Dom}u_{Max}}$ when assessed in this way.

Unfortunately, in a cell as large as an SRAM one may still need to check more than 1000 potential local minima, using test points that are initially located at the center of each large region. Eq. [3] is not difficult to solve numerically as a local problem, but it is still nonlinear, with non-linear (nonconvex) constraints. Moreover, one would usually choose to solve an even more complex local problem within each search region, using eq. [3] merely to identify the search regions. In particular, it is frequently useful to choose a local problem that extends eq. [3] in its constraints. For example, if one samples the parameter space sparsely on a hypersphere (such as is done to map out potential local intensity minima for eq. [3], but more sparsely for the present purpose), one can determine at each sampled point the maximum bright region image intensity that can be achieved in the available mask technology, and one can then fit a continuous surface to these results. It may then be desirable to add to the local problem for each region a new constraint which specifies that some minimum desired bright point intensity be achieved, i.e. that the solution must lie outside the fitted surface. This is particularly useful when mask technologies are employed that can provide much stronger positive amplitudes than negative amplitudes, such as opaque chrome or attenuated-phase-shift mask technologies.

In general, adoption of additional non-linear constraints tends to slow down the local optimization step in each potential local minimum region. The step-walk relaxation method of this invention takes the pruning of potential solutions further then pruning by region volume/size, by using linear approximations of the non-linear (true) parameter space ellipsoids.

It should also be born in mind that we would usually need to carry out our global solution method repeatedly, e.g. for different trial source solutions. In order to solve problems of SRAM size it would be desirable to be able to further reduce the number of potential local minima that need to be searched.

The invention operates on images that are characterized by their intensity values at sample points. To minimize runtime one should distribute the sample points in the simulated image plane parsimoniously; however their density must be sufficient to ensure a valid solution. (Note that the sample points described here should not be confused with the grid points in parameter space that are used to map out regions which may contain local minima; sample points for image characterization are deployed in the simulated image plane and grid points are a mathematical construct.) While the optimization method described here is based fundamentally on two kinds of sample points, namely the so-called bright sample points 216 and dark sample points 218, a convenient method for ensuring an efficient sampling is based on four sub-categories of sample points. More specifically, the bright sample points may be either of a kind termed "interior bright sample points", or a kind termed "edge sample points", while the dark sample points may be either "perimeter dark sample points", or "interior dark sample points". Interior sample points of both the bright and dark kind are laid out according to somewhat similar rules, as are edge sample points and perimeter dark sample points, though this correspondence is only partial.

Edge sample points are deployed around the boundary of the target pattern, i.e. at positions in the simulated image plane 32 where the edges of the printed pattern would ideally be located. Target patterns are typically sharp-cornered Manhattan polygons, but ordinarily one would not deploy edge sample points at the corners of such Manhattan patterns (the corners being the edge endpoints), since corner rounding is inevitable (i.e. the printed pattern cannot conform to a target edge with sharp corners). However, one does typically place edge sample points at positions that approach the corners, for example at a distance of about 0.35 λ/NA away from each corner along each edge. When the corner is at one end of a short edge, for example an edge of length less than about 0.7 λ/NA, one should place an edge sample point at the midpoint of the short edge, even though this centered sample point will be closer to the corners than 0.35 λ/NA. Further, when the short edge is at the end of a line of width narrower than about 0.35 λ/NA, it can be preferable to move the sample points on the adjacent long edges that come into the same endpoint corners (i.e. the two corners that are joined by the short edge); specifically, one should retract those sample points on the long edges which lie closest to the short-edge corners in such a way as to locate those sample points at a greater distance from the corners than the usual 0.35 λ/NA. For example, to whatever extent the linewidth is narrower than 0.35 λ/NA, one may choose to move the nearest sample points along the adjacent long edges to a distance from the end corners that is increased by about half this deficit, e.g. by 0.025 $\lambda$/NA if the narrow linewidth is 0.3 $\lambda$/NA (since (0.35−0.3)/2=0.025). However, these neighboring sample points should only be retracted to the extent that the edges they reside on are longer than twice their distance to the end corners, i.e. they should not be retracted past the edge midpoint.

Once edge sample points have been placed in the positions along each edge that are closest to the edge endpoints (corners), additional edge sample points are deployed along interior sections of edges that are longer than about 0.7 $\lambda$/NA, at positions that cover the separation between the two edge sample points that are adjacent to the endpoints (corners). Preferably these sample points are deployed evenly along the edge so as to leave no unsampled segment with a length greater than about 0.35 $\lambda$/NA; ordinarily one deploys the minimum number of edge sample points needed to meet this condition.

One further rule for placing edge sample points: Certain circuit features may contain so-called "jogs", in which lines that predominantly run in a certain direction are displaced laterally by a small distance before continuing in their predominate direction. If this jog displacement is less than about 0.3 $\lambda$/NA, the short jog edges perpendicular to the direction of displacement cannot be resolved using current printing techniques, and typically should not receive edge sample points. Otherwise, every edge should preferably contain at least one edge sample point.

In most cases it is not appropriate to place edge sample points at the corners of features, since corners cannot be sharply resolved in the printed pattern. However, if a degree of control in printed corners is desired, one can position a sample point midway around an arc that traces a rounding of the corner, with the arc's radius of curvature being e.g. 0.35 $\lambda$/NA in a typical case. The radius of this placement arc can be tightened slightly (i.e. decreased) if one wishes to tradeoff corner sharpness for process latitude.

Dark sample points are deployed in regions of the pattern that are supposed to print dark (i.e. undeveloped if the photoresist tone is positive). The subset of dark sample points that are closest to the bright regions are the so-called perimeter dark sample points. Perimeter dark sample points are typically offset from the edges of bright features by distances of roughly 0.125 $\lambda$/NA to 0.175 $\lambda$/NA. More specifically, the distance of perimeter dark sample points from the adjacent bright-feature edge should preferably be chosen to be about ½ the minimum feature size in the pattern (the so-called k1-factor), if this minimum feature size is smaller than about 0.35 $\lambda$/NA; however, when the k1-factor is larger than 0.35 $\lambda$/NA, the separation of the perimeter dark sample point from the edge should be held to about 0.175 $\lambda$/NA. (this may be considered as "the separation rule" for placement of perimeter dark sample points.) The perimeter dark sample points should usually be positioned in alignment with edge sample points, i.e. a perimeter dark sample point should usually be deployed along the perpendicular extending outward from each edge sample point. If a dark feature is narrow, the above separation rule implies that the feature will have perimeter dark sample points along its midline. In such cases each single perimeter dark sample point in the feature may be associated with more than one edge sample point, e.g. with the sample points on each of the two edges that parallel the midline.

In rare cases the above separation rule might cause a perimeter dark sample point to be positioned overly close to the corner of a second bright feature; in that case the perimeter dark sample point should be displaced laterally from the corner to achieve a separation of about 0.175 $\lambda$/NA.

As noted above, feature corners will usually not contain edge sample points. However, in the case of convex corners of bright features, it is nonetheless desirable that a perimeter dark sample point be positioned with the above spacing along a diagonal extending outward from the corner into the surrounding concave dark region, as if an optional edge sample point had in fact been placed in the corner (using the procedure described above)—A perimeter dark sample point should preferably be deployed next to such corners even when the corner does not contain an edge sample point.

When the corners of dark regions are convex, it is possible that two or more edge sample points along the boundary may prompt deployment (under the above separation rule) of perimeter dark sample points that end up being in close proximity to one another; in such cases one need deploy only a single perimeter dark sample point.

Once the perimeter dark sample points have been deployed, one should fill the remainder of extended dark regions with interior dark sample points, at a density of about $1/(0.35\ \lambda/NA)^2$ per unit area. Uniformity of sampling is not critical, but it is desirable that at least one dark sample point (perimeter or interior) be present in every compact region whose area is substantially larger than $(0.35\ \lambda/NA)^2$. With narrow dark features, deployment of the perimeter dark sample points may in itself be sufficient to eliminate all such unsampled regions; dark features that are sufficiently narrow need not contain interior dark sample points.

Similarly, bright regions that are extended should be filled with interior bright sample points, at a density of about $1/(0.35\ \lambda/NA)^2$ per unit area.

The above paragraphs refer to the use of sample points to characterize the image. However, our global optimization method can be carried out without any change in procedure if the intensities associated with sample points are actually the result of averaging the intensity over small regions centered at the points. Such averaged intensities can be represented as quadratic forms in the same way as point intensities. If the regions are small compared to the lens resolution, such averaging will generally have no significant effect on the solution. However, in some circumstances such averaging can be beneficial, for example when the intensity at dark sample points having truly point-like form would be exactly zero; averaging keeps the eigenvalues finite in such cases. For simplicity we have used the term "points" to describe all samplings, even those that are averaged over finite regions. A typical size for the regions might be 0.02 $\lambda$/NA. Sample point regions may also be slightly extended in z position through the thickness of the resist, and they may include averages over small focus excursions of the projection lens.

We should note that the above numerical rules for sample point layout are not rigid; it is reasonable to choose numerical values that differ by 20% or so from the examples given. Increasing the density of sample point layout will generally increase execution time. An excessive decrease in density will give rise to invalid solutions, i.e. solutions whose behavior between sample points (along feature edges, or in bright or dark areas) fails to match the polarity of the target pattern. One can check the adequacy of the offset used to position interior dark sample points by applying a test to the subset of perimeter dark sample points that are not deployed along the midlines of narrow dark features (i.e. those that are deployed in extended dark regions). Specifically, one checks that in a defocused plane the intensities at such perimeter dark sample points are all appreciably above zero (e.g. their intensity should not be significantly smaller than the average intensity over all dark sample points), and further that the intensity along the cutline between each perimeter sample point and its associated edge sample point contains no minima between these two sample points, i.e. the first intensity minimum along the cutline should lie further out from the edge than the position of the perimeter dark sample point. If this condition is not met, the perimeter dark sample point can be moved closer to the edge.

Figure 6:
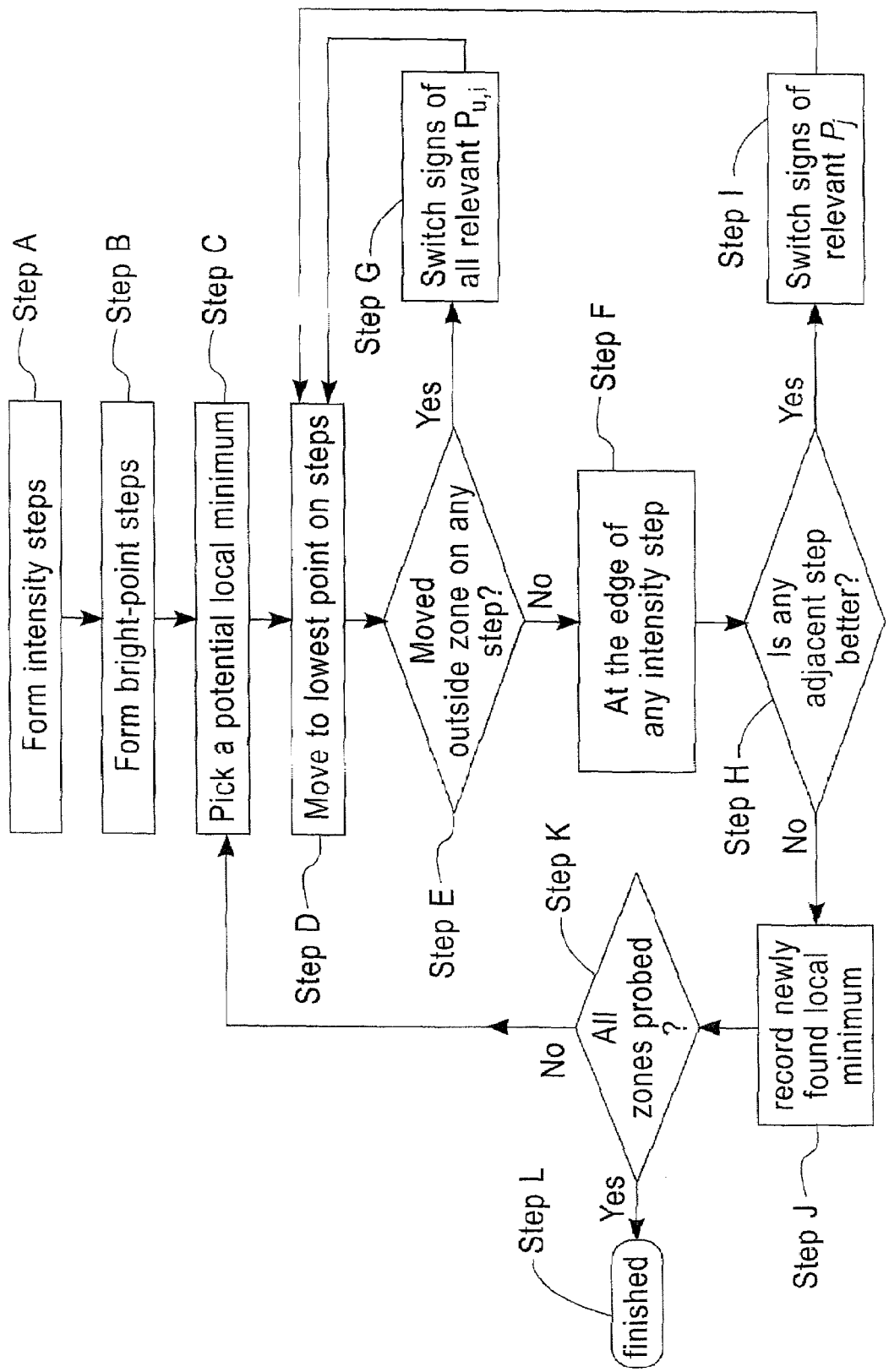
FIG. 6 is a flow chart of an exemplary embodiment of a method of the invention.

With reference to FIG. 6, there is illustrated in detail a flow chart of an exemplary embodiment of a method of the invention described above. At step A, a plurality of intensity steps 46 are formed in a parameter space 41. At step B, a plurality of bright-point intensity steps or contours, formed of linear approximations of ellipsoids corresponding to bright points in the desired mask pattern, are produced. Specifically, $P_{u,i}$ is set to denote the sign of the projection of $\vec{x}$ onto the $i^{th}$ eigenvector of the $u^{th}$ bright sample-point matrix. The set of $P_{u,i}$ thus defines a potential local minimum region. In addition, the downward intensity of the intensity steps 46 are defined in terms of steps, letting $p_j$ denote the sign of the $j^{th}$ component of $\vec{x}$.

At step C, a potential local minimum, corresponding to a pocket 45 is selected. At step D, one moves along the surfaces of the linear constrained ellipsoids 43 until a localized lowest point on the intensity steps 46 is reached. Specifically, under this stepwise approximation obtained from steps A and B the lowest point in the potential local minimum region is given by the solution to the linear programming problem:

$$\text{Minimize} \sum_j p_j x_j$$

subject to $p_j x_j$ non-negative, and: [4]

$$\sum_i \sum_j P_{u,i} w_{u,i,j} \sqrt{d_{u,i}}\, x_j \geq 1, \ (\forall\, u\,|\, 1 \leq u \leq u_{Max}),$$

where $d_{u,i}$ is the $i^{th}$ eigenvalue of $A_u$.

At step E, a determination is made if movement along a linear constrained ellipsoid 43 caused movement outside a zone defined by the linear constrained ellipsoid 43, such as when moving along a surface and beyond the edge of a linear constrained ellipsoid 43. If one has moved outside a zone, the signs of all relevant $P_{u,i}$ are switched at step G and step D is repeated. Specifically, if after solving the eq. [4] problem one finds that $$\sum_j P_{u,i} w_{u,i,j} \sqrt{d_{u,i}}\, x_j < 0 \qquad [5]$$

for any of the u,i, then one can step downward out of the region (and in doing so remove the region from further consideration). Such a step is taken by reversing the sign of $P_{u,i}$. This follows because the intensity constraint at each bright point is reverse-convex even after being stepped, so that a negative position along a step (per eq. [5]) can be converted to a lower position along an adjacent step of the same constraint ellipsoid 43. After the signs have been reversed in all u,i satisfying eq. [5], one take another step by solving eq. [4] upon repeating step D.

In an alternative embodiment, one can solve eq. [4] as a mixed integer linear programming (MILP) problem. Though MILP problems cannot always be solved efficiently, sets of MILP problems are sometimes encountered where solutions are usually found rapidly. If a MILP solution is tried and found to be efficient in a particular mask optimization problem, one may subsequently budget some time for a MILP solution when similar mask patterns are encountered. To formulate eq. [4] as a MILP, one can introduce new variables $^{(+)}y_j$, $^{(-)}y_j$, $^{(+)}Y_{u,i}$, and $^{(-)}Y_{u,i}$ that are constrained to be non-negative, and then re-write eq. [4] as:

$$\text{Minimize} \sum_j {}^{(+)}y_j + {}^{(-)}y_j$$

subject to [6]

$$\sum_i ({}^{(+)}Y_{u,i} + {}^{(-)}Y_{u,i}) \geq 1 \ (\forall\, u\,|\, 1 \leq u \leq u_{Max})$$

with added constraints $$^{(+)}Y_{u,i} - {}^{(-)}Y_{u,i} = \qquad (\forall\, u\,|\, 1 \leq u \leq u_{Max}; \qquad [7]$$

$$\sum_j w_{u,i,j} \sqrt{d_{u,i}}\, ({}^{(+)}y_j - {}^{(-)}y_j) \qquad \forall\, i\,|\, 1 \leq i \leq J_{Dom})$$

$$^{(+)}Y_{u,i} \leq \xi_{u,i} M,\ {}^{(-)}Y_{u,i} \leq (1-\xi_{u,i})M \quad (\forall\, u\,|\, 1 \leq u \leq u_{Max};$$

$$\forall\, i\,|\, 1 \leq i \leq J_{Dom})$$

$$^{(+)}y_j \leq \xi_j M,\ {}^{(-)}y_j \leq (1-\xi_j)M \qquad (\forall\, j\,|\, 1 \leq j \leq J_{Dom})$$

where the $\xi$ variables are binary integers, and where M is a fairly large number, chosen to be moderately larger than the largest expected solution coordinate, such as three times larger.

Returning to the preferred embodiment, if at step E, there was no movement outside of a zone, a check is performed at step F to determine if one is at the edge of an intensity step 46. Specifically, when no further downward steps can be taken, one is nearly ready to add the final set of u,i sign values to the list of local minima. However, one further eventuality remains to be checked at step H. It may be that the algorithm has not reached a true minimum at this point because it has stopped at an edge of the downward intensity step 46, in which case it might be possible to proceed downward by shifting onto another step. This can happen if some of the $x_j$ are zero at the conclusion of the above described process. If that is the case, one restarts the procedure with a sign change at step I in the first such $p_j$. However, the restarted procedure is only allowed to continue at step D if its first step is able to move downward.

If it is determined that one is not at the edge of an intensity step 46 and no further downward intensity steps may be taken (steps F and H), a newly found local minimum is recorded at step J. In general, when no improvement results from negating the $p_j$ of any zeroed x component, or when all of the $x_j$ are positive, one has found a new local minimum (within the step approximation).

After each time a newly found local minimum is recorded at step J, a check is performed at step K to see if all zones, or pockets 45, have been probed. If not, processing proceeds to step C for another remaining zone. If so, the process terminates at step L.

This is repeated for starting points in every large region bearing a potential local minimum, but only where the potential local minimum region (defined by the combination of $P_{u,i}$ signs) has appreciable size. Once the true local minima are found in the step approximation, these true local minima are re-evaluated using more sophisticated metrics and constraints. (Generally, one would employ a quadratic formulation like that in eq. [3].) The best solution so obtained can then be refined using a local optimizer, and before doing so one can optionally re-optimize the source distribution, or iterate between mask, source, and local optimizations.

Figure 7:
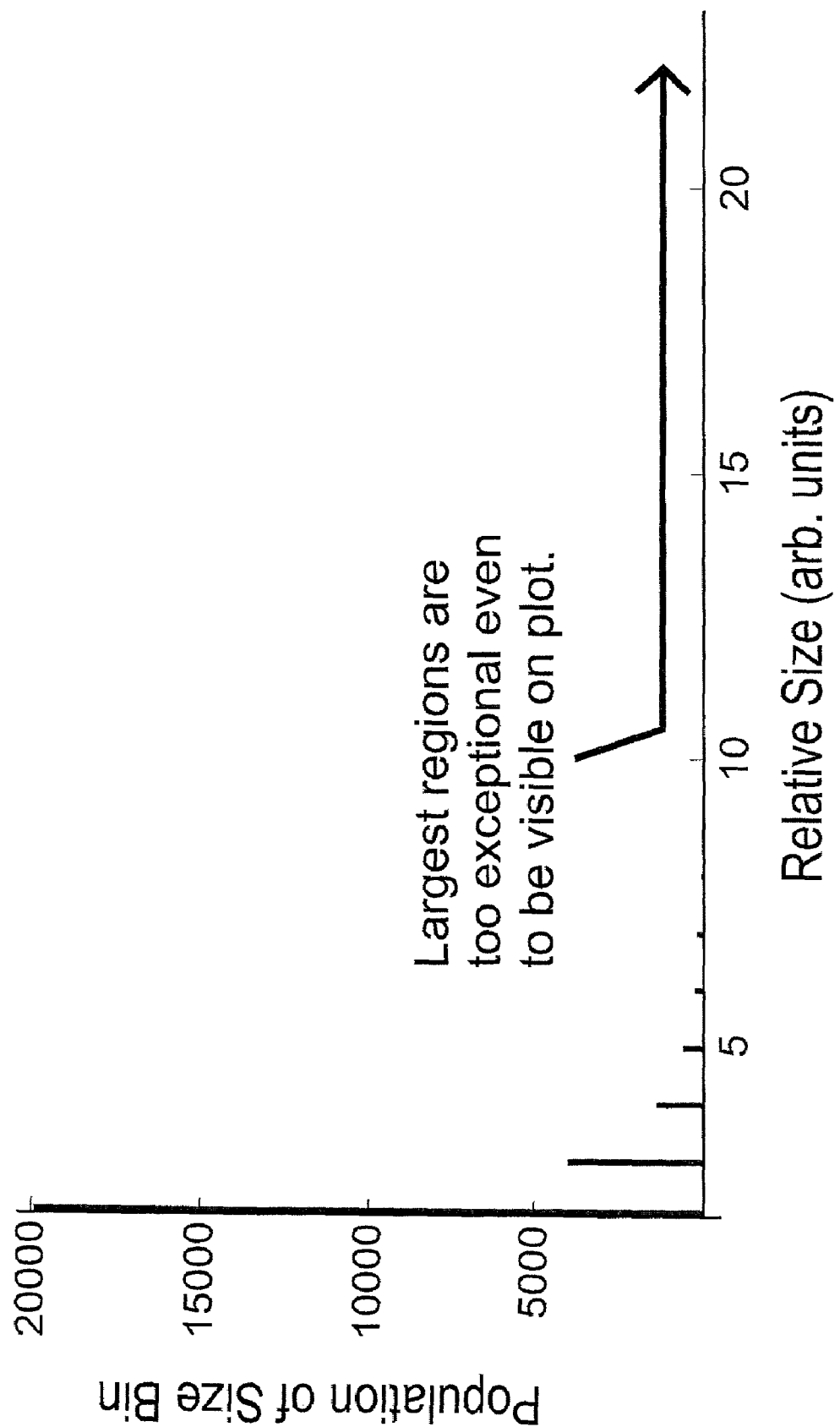
FIG. 7 is a diagram showing a test case of 890 large regions that potentially contain local minima, evaluated with an embodiment of the invention which identified 87 local minima in a fraction of the time the prior art would take.

In a test case involving global optimization of a SRAM device, the above method showed that 87 local minima were actually present within 890 large-volume regions that potentially contained local minima. The time needed to accomplish both this pruning and the assessment of the resulting 87 local minima amounted to only about one sixth the time that would have been needed to assess all 890 potential local minima. This test case is shown diagrammatically in FIG. 7.

Figure 8:
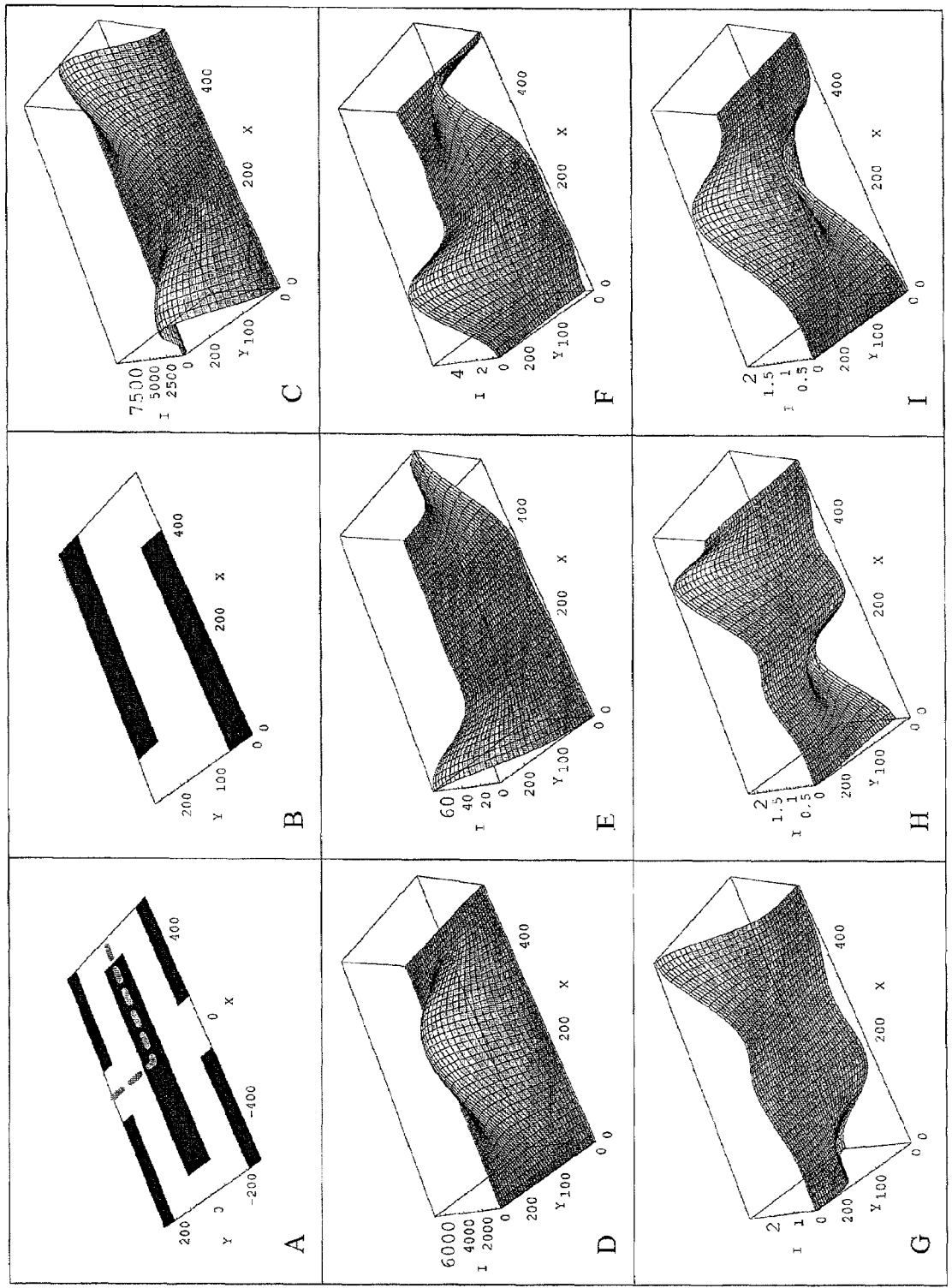
FIG. 8 show three-dimensional representations of various eigenvectors from which a minimal eigenvector set is found.

Now consider FIG. 8, which shows at panel A one section of the DRAM circuit of FIG. 2b (in which the closed rectangular areas are dark and the remaining areas are bright). Panel B shows that portion of panel A offset by dotted lines so that the dark areas are only along edges of panel B, and panels C through I are three dimensional representations of image intensities (squared Fourier transforms) of eigenvectors for panel B, each panel representing one eigenvector. The eigenvectors of panels C, D and E are necessary to fully print the bright areas of panel B. Note that panel E has considerably lower contrast as compared to panels C and D; as noted above with reference to FIG. 2a, printing line ends is more difficult than printing extended lines. Eigenvectors of panels F through I degrade contrast between the bright and dark points/areas, and are therefore not needed. The minimum eigenvector set is then shown by panels C through E, and they are joint eigenvectors for the bright and dark regions of panel B. As above, these generally align with Cartesian axes.

Figure 9:
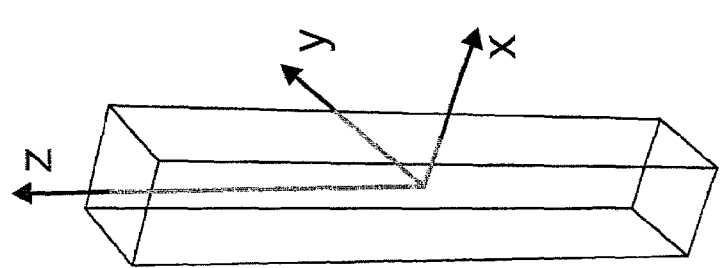
FIG. 9 is a schematic view of eigenvectors normalized so that the Euclidean sum of eigenvectors equals the dark region intensity.
Figure 9:
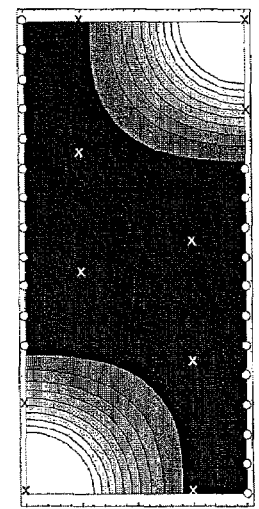
Figure 9:
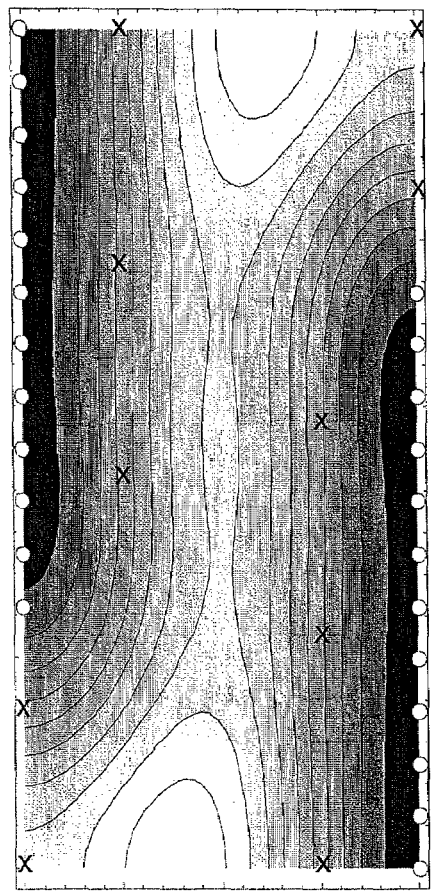
Figure 9:
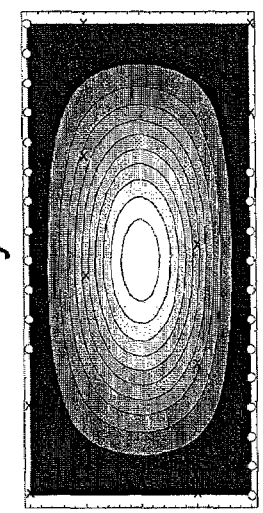
Figure 9:
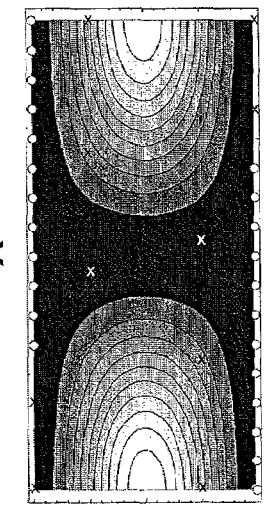

At FIG. 9, the three eigenvectors from FIG. 8 are normalized so that the Euclidean sum equals the dark region intensity. The weighted Euclidean sum equals the bright region intensity. The distance from the origin of the parameter space (right side of FIG. 9) equals the dark region intensity. The three joint eigenvectors are plotted separately at the bottom of FIG. 9, corresponding to the three Cartesian axes. The same ten bright points (each denoted by an x) are evident in each, best seen at the normalized plot of all three superposed eigenvectors at the top of FIG. 9. Optimal mask orders will largely be contained within a subspace spanned by the three dominant joint bright/dark eigenvectors, since as was seen in FIG. 8 the remaining eigenvectors degrade contrast.

Figure 10:
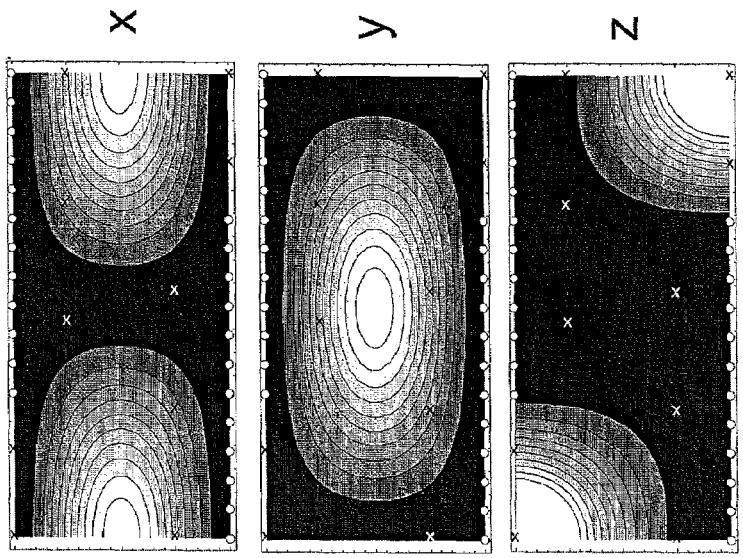
FIG. 10 is a schematic view of ellipsoid boundaries relative to test point intensity.
Figure 10:
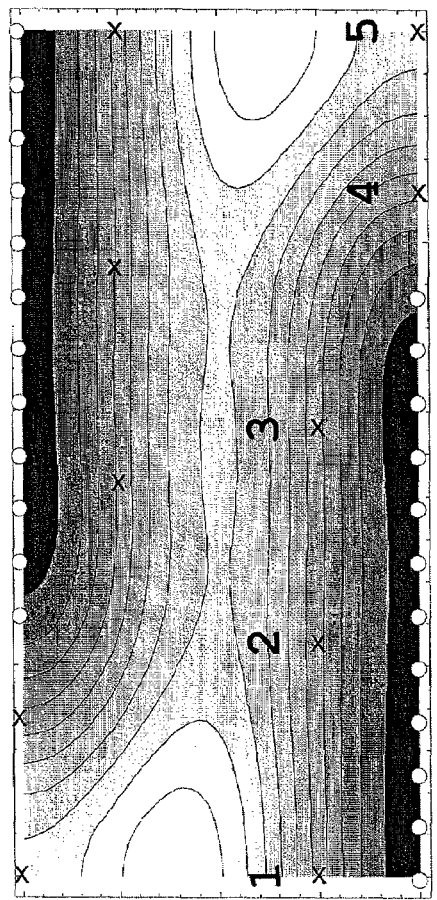
Figure 10:
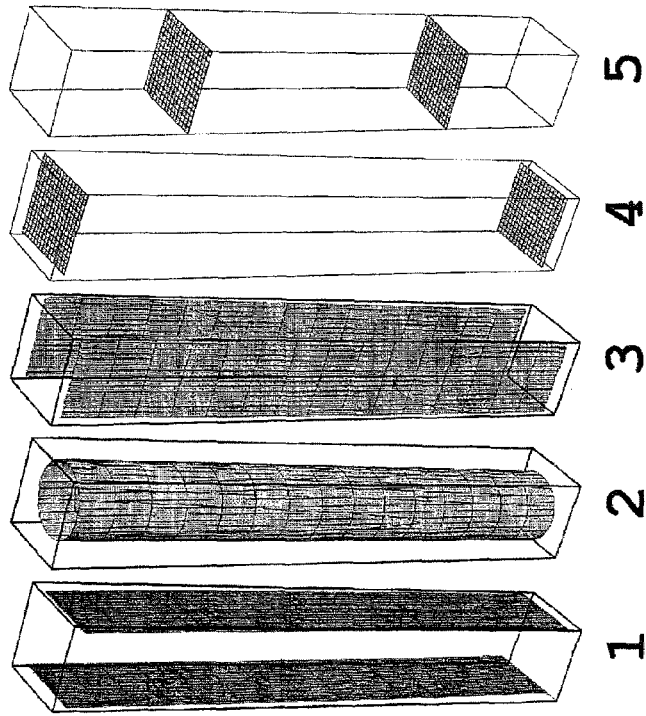

Now consider FIG. 10, which repeats for convenience the same four plots of bright and dark points from FIG. 9. Shown in geometries 1 through 5 are the ellipsoid boundaries within the parameter space, with the bright points they identify shown also numbered as 1 through 5 at the top of FIG. 10. Note that the ellipsoid boundaries tend to intersect at fairly large angles. The contour line of the graph at the top of FIG. 10 of minimum acceptable intensity of a bright point will be an ellipsoid, almost always elongated, in the parameter space. The solution point must lie outside every such contour.

Figure 11:
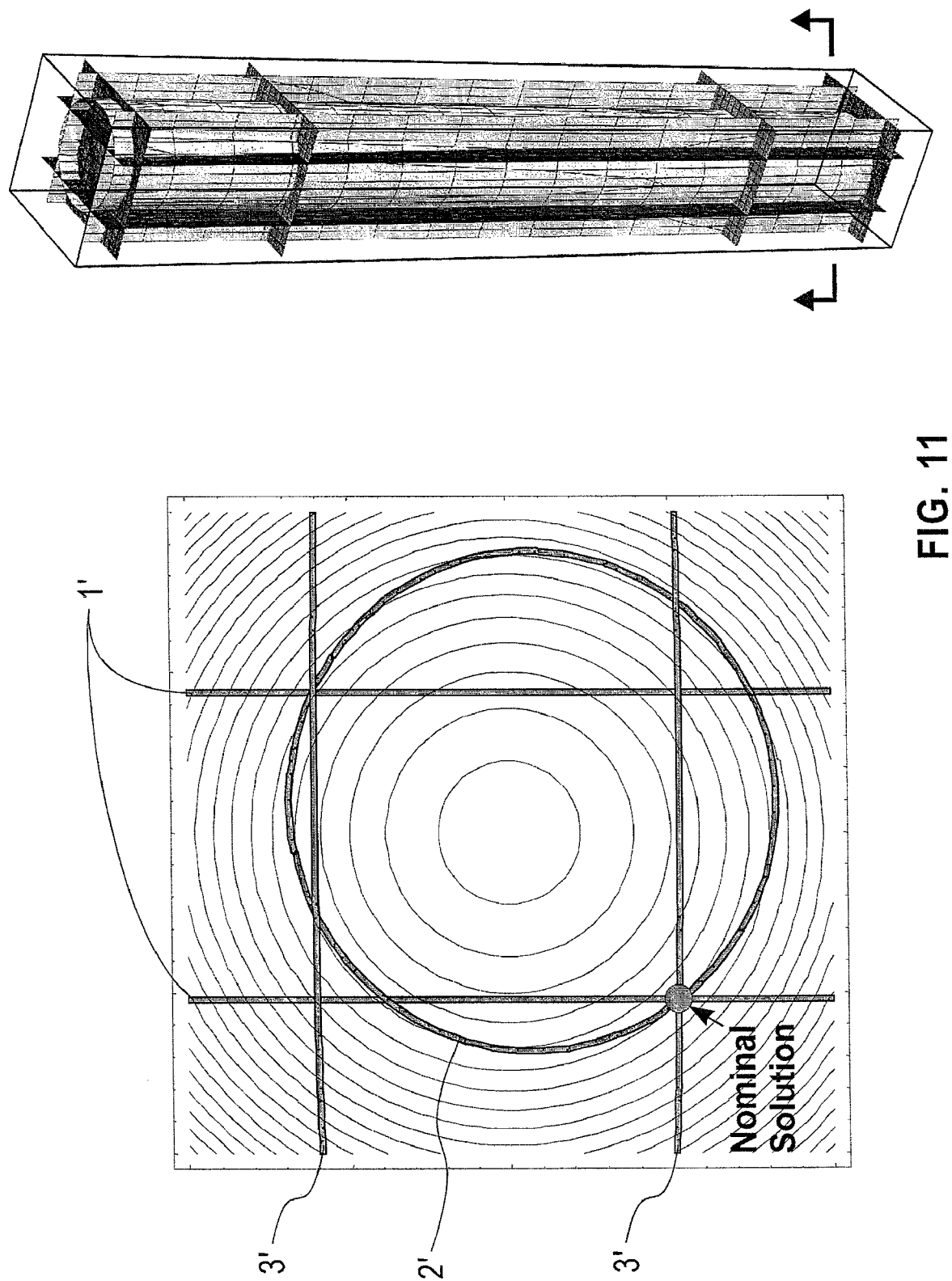
FIG. 11 is a composite view of the different boundaries of FIG. 10, and a sectional view of that composite showing a test point nominal solution.

In FIG. 11, the five geometries of FIG. 10 are assembled into a composite. The indicated sectional view of that composite is shown also in FIG. 11, and projections from the first three geometries 1, 2, 3 are shown in the sectional view as 1', 2', and 3', respectively. Since the ellipsoid for the fifth geometry (5 in FIG. 10) is approximately flat near the solution, we can plot the solution in a two dimensional (horizontal) plane, and therefore the sectional view is taken along the plane of ellipsoid #5. To maximize contrast in the defocused plane, the solution point must be as close as possible to the origin (see FIG. 9) while lying outside each of the ellipsoids. Note in the sectional view that ellipsoid #3 constrains the solution only minimally as compared to the combined constraints of ellipsoid numbers 1 and 2. FIGS. 9-11 show conceptually how the solution space is set-up with ellipsoids and intensity contours, and how its dimensionality is reduced by ignoring joint eigenvectors that have reversed contrast. As detailed above though, embodiments of this invention use a joint eigenvector formulation to reduce the number of promising local minima that need to be checked by ignoring the narrow or low-volume pockets. Since the joint eigenvectors tend to be spatially separated and adjacent to only a few bright spots, the constraint ellipsoids (five in FIG. 10) tend to be aligned with Cartesian axes of the parameter space. Fewer deep local minima are formed between the ellipsoids, and for reasons noted above the narrower local minima spaces can be ignored (low MEF, low 'volume' and most often shallow). The true global solution is most likely within one of these fewer deep local minima, so computations are greatly reduced.

Although described in the context of particular embodiments, it will be apparent to those skilled in the art that a number of modifications and various changes to these teachings may occur. Thus, while the invention has been particularly shown and described with respect to one or more embodiments thereof, it will be understood by those skilled in the art that certain modifications or changes may be made therein without departing from the scope and spirit of the invention as set forth above, or from the scope of the ensuing claims.

What is claimed is:

1. A method for identifying candidate globally optimum inputs for generation of outputs that optimally approximate according to a performance metric a binary target pattern of areas constrained to be bright and areas constrained to be dark, where the output is inherently non-negative and depends in a quadratic way on the inputs, comprising:

forming a solution space for the inputs from dominant joint eigenvectors for quadratic forms of bright and dark areas of a target pattern, mapping the solution space to identify regions that include at most one local minimum, selecting at least some of the regions for test point analysis;

generating stepped intensity contours for the dark areas and stepped constraint surfaces at individual test points, within each selected region, progressively moving an individual test point to the lowest intensity contour step along all constraint steps present in the large region, for each individual test point at the lowest intensity contour step of the large region, reducing intensity to a lowest intensity contour step in an adjacent selected region if available;

for each individual test point at an edge of an intensity contour step, testing whether an intensity contour step of an adjacent selected region is lower, and if so, reducing intensity of that individual test point to a lowest intensity contour step of the adjacent region to yield a final test point;

compiling the final test points at their respective lowest intensity contour step as a set of candidate global optima, evaluating the candidate global optima using the performance metric to determine one globally optimum input solution; and making a mask from the one globally optimum input solution.

2. The method of claim 1, wherein each of the stepped constraint surfaces comprise linear approximations of ellipsoids.

3. The method of claim 2, wherein the steps between constraint surfaces are flat.

4. The method of claim 1, wherein the regions comprise large volume regions and small volume regions, and selecting at least some of the regions comprises selecting only the large volume regions.

5. The method of claim 4, wherein the at most one local minimum comprises at most one local minimum intensity for a dark area.

6. The method of claim 4, wherein the large volume regions are identified by approximating a volume bounded by each constraint surface as a combination of signs (+ and −) of positive projections of the constraint surface against axes of the constraint surface.

7. The method of claim 6, wherein selecting only the large volume regions comprises grouping the regions by the positive projections against the axes of the constraint surfaces, and for each group, selecting the large volume regions that are nearer than the small volume regions to an origin of the solution space through which the axes pass.

8. The method of claim 1, wherein the dominant joint eigenvectors are constrained to be bright for the bright areas by weighting bright points at boundaries of the bright areas greater than bright points at interiors of the bright areas.

9. The method of claim 8, wherein the dominant joint eigenvectors for the target pattern are constrained to be dark for the dark areas by weighting dark points at a perimeter of the dark areas greater than dark points at interiors of the dark areas.

10. The method of claim 1, executed by a processor in combination with a computer program tangibly embodied on a computer readable memory.

11. The method of claim 1, wherein the mask is an optical mask for printing circuit patterns.

12. A computer readable memory storing a program of machine-readable instructions, executable by a digital processing apparatus and configured to perform operations to identify candidate globally optimum inputs for generation of outputs that optimally approximate according to a performance metric a binary target pattern of areas constrained to be bright and areas constrained to be dark, where the output is inherently non-negative and depends in a quadratic way on the inputs, the operations comprising:

forming a solution space for the inputs from dominant joint eigenvectors for quadratic forms of bright and dark areas of a target pattern, mapping the solution space to identify regions that include at most one local minimum, selecting at least some of the regions for test point analysis;

generating stepped intensity contours for the dark areas and stepped constraint surfaces at individual test points, within each selected region, progressively moving an individual test point to the lowest intensity contour step along all constraint steps present in the large region, for each individual test point at the lowest intensity contour step of the large region, reducing intensity to a lowest intensity contour step in an adjacent selected region if available;

for each individual test point at an edge of an intensity contour step, testing whether an intensity contour step of an adjacent selected region is lower, and if so, reducing intensity of that individual test point to a lowest intensity contour step of the adjacent region to yield a final test point;

compiling the final test points at their respective lowest intensity contour step as a set of candidate global optima;

evaluating the candidate global optima using the performance metric to determine one globally optimum input solution; and making a mask from the one globally optimum input solution.

13. The computer readable memory of claim 12, wherein each of the stepped constraint surfaces comprise linear approximations of ellipsoids.

14. The computer readable memory of claim 13, wherein the steps between constraint surfaces are flat.

15. The computer readable memory of claim 12, wherein the regions comprise large volume regions and small volume regions, and selecting at least some of the regions comprises selecting only the large volume regions.

16. The computer readable memory of claim 15, wherein the at most one local minimum comprises at most one local minimum intensity for a dark area.

17. The computer readable memory of claim 15, wherein the large volume regions are identified by approximating a volume bounded by each constraint surface as a combination of signs (+ and −) of positive projections of the constraint surface against axes of the constraint surface.

18. The computer readable memory of claim 17, wherein selecting only the large volume regions comprises grouping the regions by the positive projections against the axes of the constraint surfaces, and for each group, selecting the large volume regions that are nearer than the small volume regions to an origin of the solution space through which the axes pass.

19. The computer readable memory of claim 12, wherein the dominant joint eigenvectors are constrained to be bright for the bright areas by weighting bright points at boundaries of the bright areas greater than bright points at interiors of the bright areas.

20. The computer readable memory of claim 19, wherein the dominant joint eigenvectors for the target pattern are constrained to be dark for the dark areas by weighting dark points at a perimeter of the dark areas greater than dark points at interiors of the dark areas.

* * * * *